United States Patent
Wu et al.

(10) Patent No.: US 11,791,777 B2
(45) Date of Patent: Oct. 17, 2023

(54) WIDEBAND AMPLIFIER LINEARIZATION TECHNIQUES

(71) Applicant: Kyocera International Inc., San Diego, CA (US)

(72) Inventors: Kun-Long Wu, San Diego, CA (US); James June-Ming Wang, Pasadena, CA (US)

(*) Notice: Subject to any disclaimer, the term of this patent is extended or adjusted under 35 U.S.C. 154(b) by 107 days.

(21) Appl. No.: 17/406,585

(22) Filed: Aug. 19, 2021

(65) Prior Publication Data

US 2022/0060152 A1 Feb. 24, 2022

Related U.S. Application Data

(60) Provisional application No. 63/067,499, filed on Aug. 19, 2020.

(51) Int. Cl.
  *H03F 3/45* (2006.01)
  *H03F 1/32* (2006.01)
  *H03F 1/42* (2006.01)

(52) U.S. Cl.
  CPC ............ *H03F 1/3211* (2013.01); *H03F 1/42* (2013.01); *H03F 3/45269* (2013.01); *H03F 2200/36* (2013.01); *H03F 2200/451* (2013.01)

(58) Field of Classification Search
  CPC ...... H03F 1/3211; H03F 1/42; H03F 3/45269; H03F 2200/36; H03F 2200/451; H03F 3/45632; H03F 3/45183
  USPC .......................................... 330/261, 252–254
  See application file for complete search history.

(56) References Cited

U.S. PATENT DOCUMENTS

| | | | |
|---|---|---|---|
| 4,804,926 A | 2/1989 | Woo | 330/149 |
| 5,079,515 A * | 1/1992 | Tanimoto | H03F 1/3211 330/261 |
| 7,019,594 B2 * | 3/2006 | Chu | H03F 3/195 330/306 |
| 2004/0119536 A1 | 6/2004 | Kwon et al. | 330/254 |
| 2005/0200411 A1 | 9/2005 | Chang et al. | H03F 3/45 |
| 2009/0153244 A1 | 6/2009 | Jose et al. | 330/253 |
| 2017/0373640 A1 | 12/2017 | Xiaoping et al. | H03D 7/14 |

OTHER PUBLICATIONS

PCT prepared International Search Report and Written Opinion for application PCT/US2021/046782 dated Dec. 9, 2021.

* cited by examiner

*Primary Examiner* — Andrea Lindgren Baltzell
*Assistant Examiner* — Khiem D Nguyen
(74) *Attorney, Agent, or Firm* — Zheng Jin; Imperium Patent Works

(57) ABSTRACT

A wideband power amplifier (PA) linearization technique is proposed. A current interpolation technique is proposed to linearize power amplifiers over a wide bandwidth. The wideband power amplifier linearization technique employs a novel transconductance Gm linearizer using a current interpolation technique that achieves improvement in the third order intermodulation over wide bandwidth for a sub-micron CMOS differential power amplifier. By using a small amount of compensating bias into an opposite phase differential pair, linearization over wide bandwidth is achieved and can be optimized by adjusting the compensating bias.

20 Claims, 6 Drawing Sheets

(a)

(b)

(c)

(d)

------ WITHOUT LINEARIZATION
——— WITH LINEARIZATION

WIDEBAND AMPLIFIER LINEARIZATION TECHNIQUES

CROSS REFERENCE TO RELATED APPLICATIONS

This application claims priority under 35 U.S.C. § 119 from U.S. Provisional Application No. 63/067,499, entitled "Wideband Amplifier Linearization Techniques," filed on Aug. 19, 2020, the subject matter of which is incorporated herein by reference.

TECHNICAL FIELD

The disclosed embodiments relate generally to power amplifier, and, more particularly, to radio frequency (RF) amplifier linearization techniques.

BACKGROUND

A fundamental component of a mobile communication system is power amplifiers (PAs). Power amplifiers are indispensable component in the mobile communication system and are inherently nonlinear. To reduce the nonlinearity, a power amplifier can be backed off to operate within the linear portion of its operating curve. To improve the power amplifier efficiency without compromising its linearity, power amplifier linearity is essential. Various linearization techniques for power amplifiers are used for linearity and power efficiency improvement in mobile communication systems.

FIG. 1 (prior art) illustrates an NMOS power amplifier PA 100 biased at lower bias condition. In order to achieve good efficiency and high power, the power amplifier usually is biased at lower bias condition which is so called Class-AB or Class-B. However, this kind of bias condition introduce non-linear Capacitance variation, especially at higher output power. The nonlinear capacitance of Cgs mainly restrict the performance of the Class-AB power amplifier. Class-AB is usually biased at deep Class-AB closed to Class-B for high efficiency. As depicted in FIG. 1, however, the Cgs variation of M1 has a large swing at high power.

The nonlinear capacitance of Cgs distorts the input large signal. AM-AM distortion is the difference between the supply voltage and the envelope of the RF output voltage. AM-PM distortion is an unwanted phase modulation of the RF output carrier due to the modulation of the supply voltage. Intermodulation distortion can occur when two or more signals are mixed through a non-linear amplifier device. Each of the tones interacts with each other, producing altered (or modulated) amplitudes. Thus, it is termed Intermodulation Distortion because it is between harmonic frequencies.

The supply voltage of a sub-micron CMOS transistor approaches one volt or below. This would result in a very limiting linear output power and a poor third-order intermodulation (IM3) in amplifier design. Poor linearity of the amplifier impairs the signal quality and dynamic range as measured with intermodulation product or Error vector magnitude (EVM) metric. For OFDM signal used in WiFi or Cellular networks, the RF signal consists of many sub-carriers at narrow frequency spacing with signal bandwidth from 20 MHz to Giga Hz. The linearity of the amplifier should be maintained over such wide bandwidth to ensure the overall signal quality. Unfortunately, many existing linearization techniques only work in a narrow bandwidth. A wideband power amplifier linearization technique is desired.

SUMMARY

A wideband power amplifier (PA) linearization technique is proposed. A current interpolation technique is proposed to linearize power amplifiers over a wide bandwidth. The wideband power amplifier linearization technique employs a novel transconductance Gm linearizer using a current interpolation technique that achieves improvement in the third order intermodulation over wide bandwidth for a sub-micron CMOS differential power amplifier. By using a small amount of compensating bias into an opposite phase differential pair, linearization over wide bandwidth is achieved and can be optimized by adjusting the compensating bias.

In one embodiment, a power amplifier receives an input signal by a first differential transistor pair of MN1 and MN2. MN1 gate and MN2 gate are coupled to an input node, and MN1 drain and MN2 drain are positive-coupled to an output node. The PA receives the input signal by a second differential transistor pair of MN3 and MN4. MN3 gate and MN4 gate are coupled to the input node, and MN3 drain and MN4 drain are negative-coupled to the output node. A first normal tail biasing transistors MB1 supplies an operating bias current to the first differential transistor pair. A second compensating tail biasing transistors MB2 supplies a compensating bias current to the second differential transistor pair. The compensating bias current is to be subtracted from the operating bias current to achieve linearization of the PA.

Other embodiments and advantages are described in the detailed description below. This summary does not purport to define the invention. The invention is defined by the claims.

DETAILED DESCRIPTION

Reference will now be made in detail to some embodiments of the invention, examples of which are illustrated in the accompanying drawings.

Figure 1:
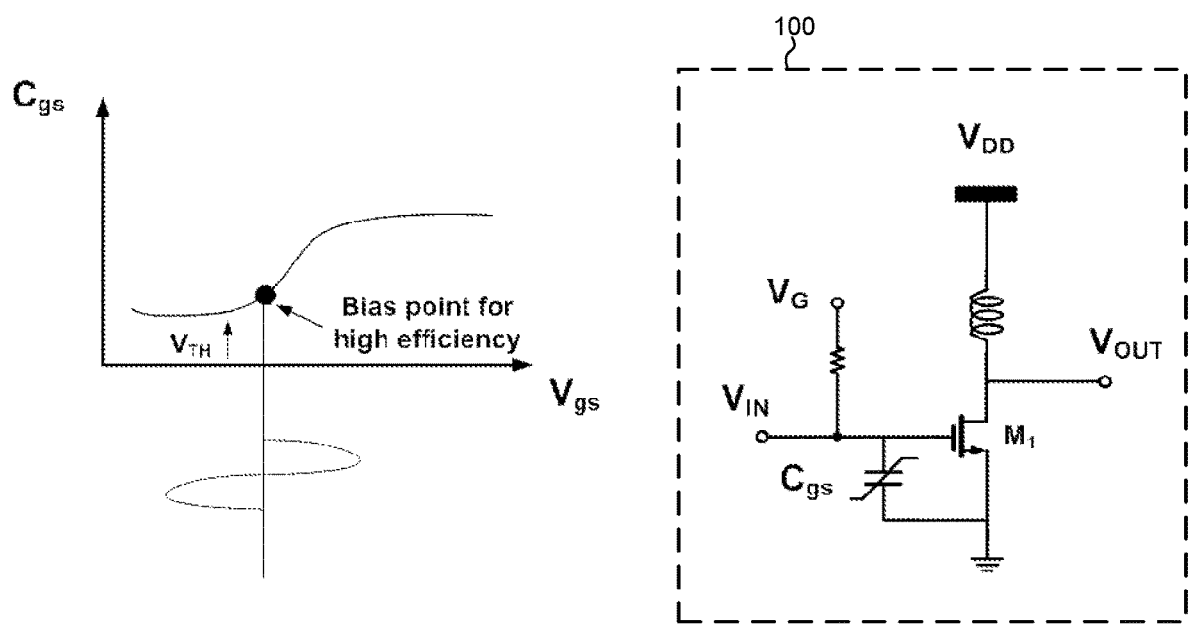
FIG. 1 (prior art) illustrates an NMOS power amplifier PA biased at lower bias condition.
Figure 2:
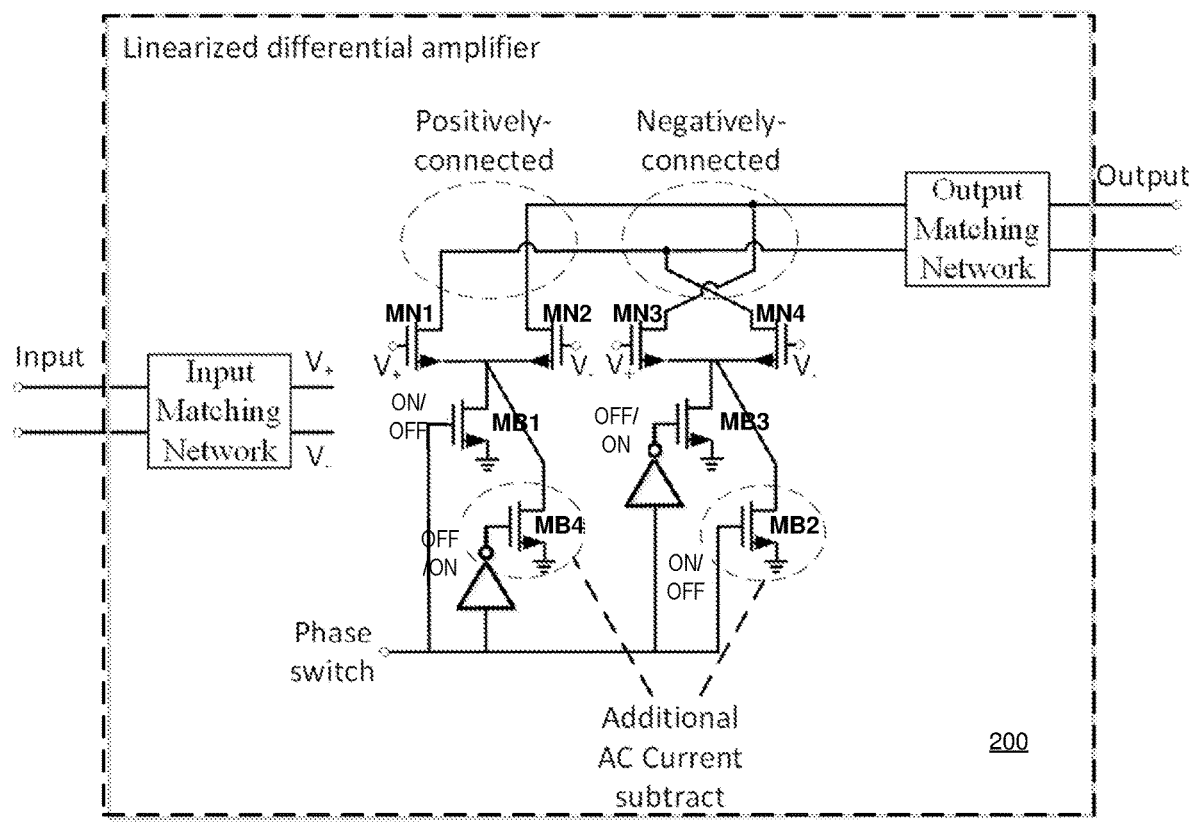
FIG. 2 illustrates a CMOS differential power amplifier PA with a transconductance Gm linearizer in accordance with one novel aspect.

FIG. 2 illustrates a CMOS differential power amplifier PA 200 with a transconductance Gm linearizer in accordance with one novel aspect. NMOS is an n-type metal-oxide-semiconductor field-effect transistor (MOSFET). An NMOS transistor consists of n-type source and drain and a p-type substrate. When a voltage is applied to the gate, holes in the body (p-type substrate) are driven away from the gate. This allows the formation of an n-type channel between the source and the drain, and a current is conducted from electrons from the source to the drain through an induced n-type channel. PMOS is a p-type MOSFET. A PMOS transistor consists of a p-type source and drain and an n-type substrate. When a positive voltage is applied between source and gate (negative voltage between gate and source), a p-type channel with opposite polarities is formed between source and drain. A current is passed through holes from the source to the drain through a p-type induced channel. CMOS technology is the combination of NMOS and PMOS.

In FIG. 2, CMOS power amplifier PA 200 comprises an input matching network (IMN), an output matching network (OMN), a first differential NMOS transistor pair of MN1 and MN2, and a second differential NMOS transistor pair of MN3 and MN4. In addition, the first NMOS pair is connected to two tail biasing transistors MB1 and MB4; and the second NMOS pair is also connected to two tail biasing transistors MB3 and MB2. Due to the nonlinear current-voltage (I-V) characteristic curve of CMOS transistors, a power amplifier is inherently nonlinear. The nonlinearity causes undesirable input to output distortion. The AM-AM distortion is the difference between the supply voltage and the envelope of the RF output voltage. AM-PM distortion is an unwanted phase modulation of the RF output carrier due to the modulation of the supply voltage. Intermodulation distortion can occur when two or more signals are mixed through a non-linear amplifier device. Each of the tones interacts with each other, producing altered (or modulated) amplitudes. Thus, it is termed Intermodulation Distortion because it is between harmonic frequencies.

To improve the power amplifier efficiency without compromising its linearity, power amplifier linearity is essential. However, the supply voltage of the sub-micron CMOS transistor approaches one volt or below. This would result in a very limiting linear output power and poor third-order intermodulation (IM3) in amplifier design. Poor linearity of the amplifier impairs the signal quality and dynamic range as measured with intermodulation product or EVM metric. For OFDM signal used in WiFi or Cellular networks, the RF signal consists of many sub-carriers at narrow frequency spacing with signal bandwidth from 20 MHz to Giga Hz. The linearity of the amplifier should be maintained over such wide bandwidth to ensure the overall signal quality. Unfortunately, many existing linearization techniques only work in a narrow bandwidth.

In accordance with one novel aspect, a wideband amplifier linearization technique is proposed, which employs a novel transconductance Gm linearizer that achieves improvement in the third order intermodulation over wide bandwidth for a sub-micron CMOS differential amplifier. PA 200 consists of two differential transconductance transistor pairs, each supplied with a bias current. A normal operating bias current is supplied to one pair while a compensating bias current is supplied to the complementary pair with opposite phase. The idea of a compensating current source is to generate a negative-phase compensating bias current to be subtracted by the positive-phase normal operating bias current from the main current source. This is called current interpolation. The compensating bias current is generally smaller than the normal operating bias current and the goal is to linearize the transistor Gm without significantly reducing the gain of the amplifier.

In the example of FIG. 2, PA 200 consists of two differential transconductance transistor pairs. The first pair (MN1 and MN2) is a positive-connected from the transistor drain terminals to the output load matching network. The second pair (MN3 and MN4) is a negative-connected from the transistor drains to the output matching network. Note that such complementary connection (positive and negative) are used to provide positive-phase gain $\Delta/2$ or negative phase gain $-\Delta/2$ to the amplifier if the two complementary transistor pairs are equally biased. In the convention implementation, for fixed gain amplifier, only one of the differential transconductance transistor pairs is turned on.

By parallel connection of multiple sets of complementary differential transconductance transistor pairs with different amount of gain adjustments $+/-\Delta_1/2$, $+/-\Delta_2/2$, . . . between the same input matching network and output matching network, a variable gain amplifier can be formed. Among the multiple sets of complementary differential transconductance transistor pairs, some of the positively connected ones are activated contributing to current addition and negatively connected ones if activated contribute to current subtraction. The amplifier gain is determined by a combination of which of the positively connected ones are activated and which of the negatively connected one are activated.

Note that the current bias of the differential transconductance transistor pair is supplied between the common source terminal of the differential transistor pair and ground by a tail biasing transistor. In the proposed invention, two tail biasing transistors are attached to the common source terminal of each differential transconductance transistor pair and the ground. For example, tail biasing transistors MB1 and MB4 are attached to the common source terminal of the first differential transistor pair (MN1 and MN2); and tail biasing transistors MB3 and MB2 are attached to the common source terminal of the second differential transistor pair (MN3 and MN4). Tail biasing transistors MB1 and MB2 forming one pair, while tail biasing transistors MB3 and MB4 forming another pair. Within each pair, a first tail biasing transistor is referred to as a normal tail biasing transistor (e.g., MB1 and MB3), while a second tail biasing transistor is referred to as a compensating tail biasing transistor (e.g., MB2 and MB4).

Each tail bias transistor pair supply different amounts of bias currents to the transconductance transistor pairs with the first normal tail bias transistor supplying the normal operating bias current for the amplifier and the second compensating tail transistor supplying a compensating bias current to the complementary (oppositely phase) differential transconductance transistor pair. For example, for positive phase gain, MB1 supplies a normal operating bias current for the first pair (MN1 and MN2), while MB2 supplies a compensating bias current for the second pair (MN3 and MN4). Similarly, for negative phase gain, MB3 supplies a normal operating bias current for the second pair (MN3 and MN4), while MB4 supplies a compensating bias current for the first pair (MN1 and MN2). The compensating bias current is generally smaller than the normal operating bias current and its goal is to linearize the transistor Gm without significantly reducing the gain of the amplifier.

A control signal called "phase switch" is used to control the two tail biasing transistor pairs. The control signal either turn on the normal tail biasing transistor of a positive-connected differential transconductance transistor pair to determine the positive gain $\Delta/2$, or turn on the normal tail biasing transistor of a negative-connected differential transconductance transistor pair to determine the negative gain $-\Delta/2$. The control signal also turns on the compensating tail biasing transistor of the complementary differential transconductance transistor pair to achieve linearization.

Figure 3A:
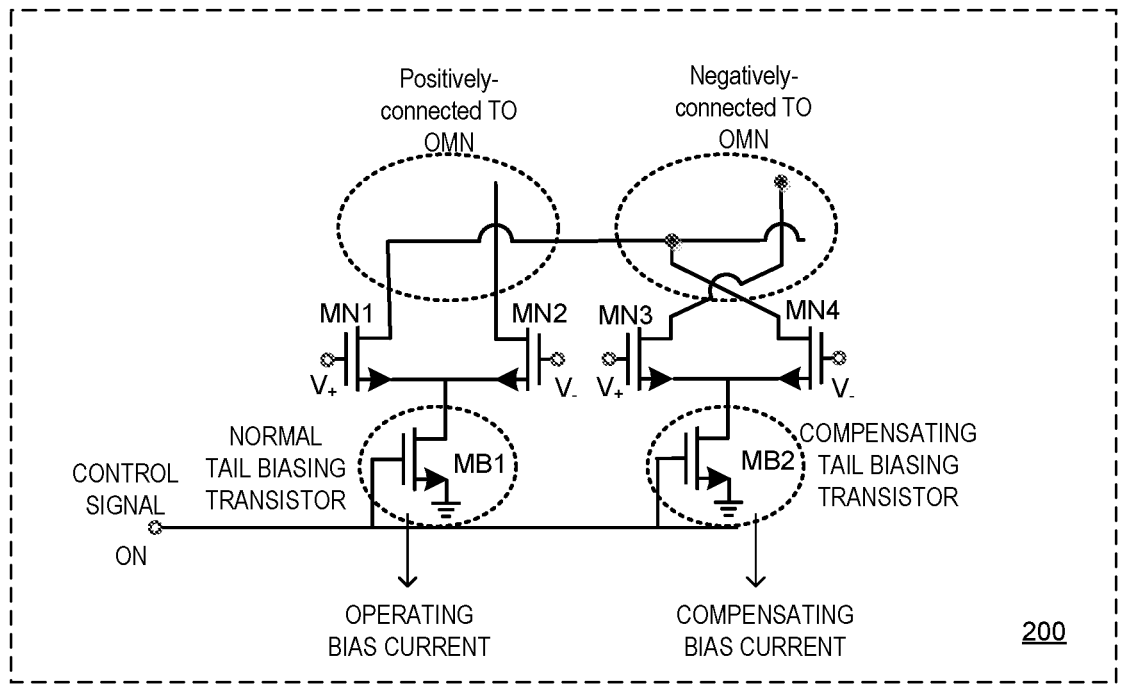
FIG. 3A illustrates one embodiment of a linearized power amplifier that provides a positive phase gain in accordance with one novel aspect.

FIG. 3A illustrates one embodiment of a linearized power amplifier 200 that provides a positive phase gain in accordance with one novel aspect. For positive phase gain Δ/2, the control signal turns on the normal tail biasing transistor MB1 and the positive-connected differential transconductance transistor pair (MN1 and MN2). The control signal also turns on the compensating tail biasing transistor MB2 of the complementary differential transconductance transistor pair (MN3 and MN4) to achieve linearization.

Figure 3B:
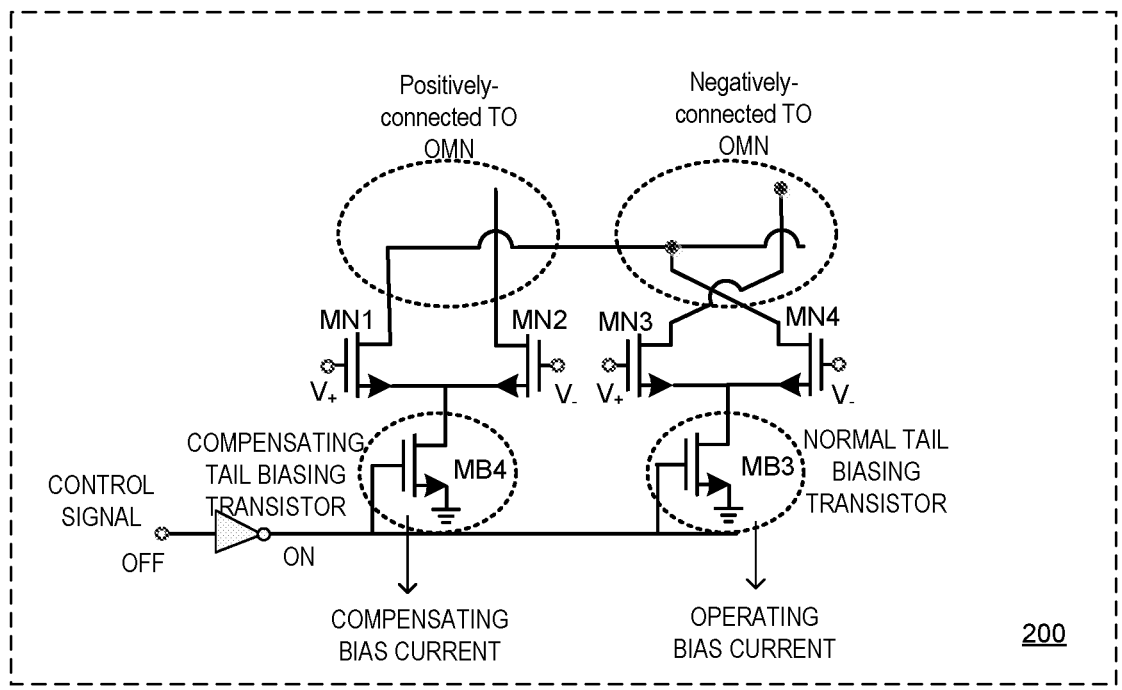
FIG. 3B illustrates another embodiment of a linearized power amplifier that provides a negative phase gain in accordance with one novel aspect.

FIG. 3B illustrates another embodiment of a linearized power amplifier 200 that provides a negative phase gain in accordance with one novel aspect. For negative phase gain −Δ/2, the control signal turns on the normal tail biasing transistor MB3 and the negative-connected differential transconductance transistor pair (MN3 and MN4). The control signal also turns on the compensating tail biasing transistor MB4 of the complementary differential transconductance transistor pair (MN1 and MN2) to achieve linearization.

The idea of current interpolation is to compensating a main current source by generating a negative-phase current to be subtracted by the positive-phase current from the main current source. The normal operating bias current and the compensating bias current can be controlled by adjusting the tail biasing transistor size. In a preferred embodiment, the normal tail biasing transistors MB1 and MB3 are small size transistors, while the compensating tail biasing transistors MB2 and MB4 are large size transistors, such that the compensating bias current is generally smaller than the normal operating bias current to achieve linearization. The key point is to use the different turn-on channel resistance, $R_{ch}$, at differential amplifier source terminal to adjust the differential amplifier biasing current, $I_d$.

$$I_d = \frac{I_{d0}}{1 + \frac{I_{d0} R_{ch}}{V_{ov}}}$$

$$R_{ch} \propto \frac{1}{W}$$

Where
- $I_{d0}$ is the amplifier drain current without $R_{ch}$
- $V_{ov}$ is the transistor over drive voltage
- $R_{ch}$ is the transistor channel resistance
- W is the transistor channel width (size)

It can be seen that the transistor channel resistance $R_{ch}$ is inversely proportional to the channel width, W, of the transistor. As a result, large channel width (e.g., large transistor size) will lower the $R_{ch}$, which in turn will lower the amplifier drain current. Similarly, small channel width (e.g., small transistor size) will increase the $R_{ch}$, which in turn will increase the amplifier drain current.

For positive phase amplifier as depicted in FIG. 3A, the positively-connected differential pair (MN1,MN2) is biased with relative high normal operating bias current. The normal tail biasing transistor MB1 channel resistance is thus designed as small as possible. At the same time, the negatively-connected differential pair (MN3, MN4) becomes the complementary pair and is biased with relative low compensating bias current. The compensating tail biasing transistor MB2 channel resistance is thus designed to be higher than the channel resistance of the normal tail biasing transistor MB1.

For negative phase amplifier as depicted in FIG. 3B, the negatively-connected differential pair (MN3,MN4) is biased with relative high normal operating bias current. The normal tail biasing transistor MB3 channel resistance is thus designed as small as possible. At the same time, the positively-connected differential pair (MN1, MN2) becomes the complementary pair, and is biased with relative low compensating bias current. The compensating tail biasing transistor MB4 channel resistance is thus designed to be higher than the channel resistance of the normal tail biasing transistor MB3.

Figure 4:
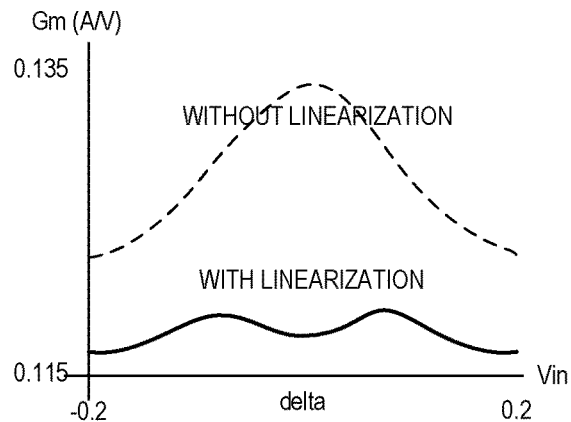
FIGS. 4A, 4B, 4C, and 4D illustrate simulated transconductance results of the differential amplifier in 65 nm CMOS process in accordance with one novel aspect.
Figure 4:
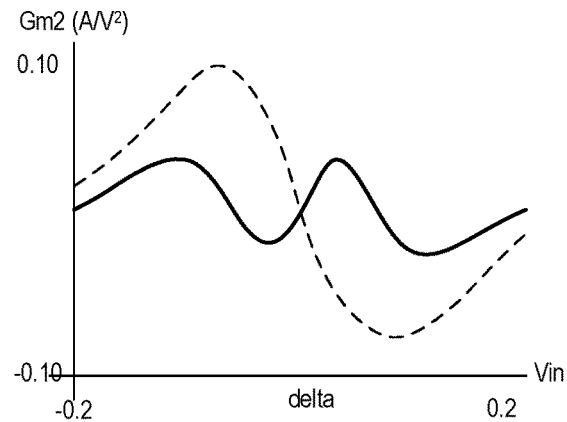
Figure 4:
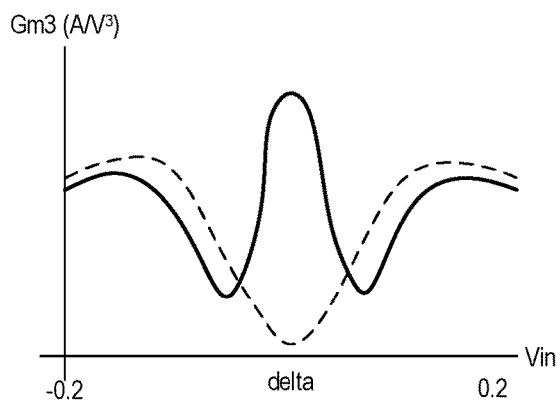
Figure 4:
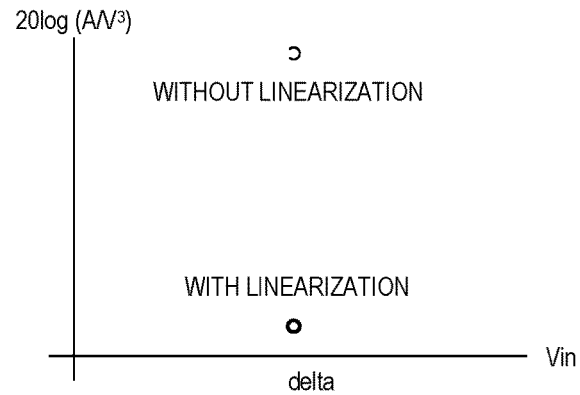

FIGS. 4A-4D illustrate simulated transconductance Gm results of the differential amplifier in 65 nm CMOS process in accordance with one novel aspect. For large signal operation, amplifiers would suffer from non-linearity of the transconductance (Gm). In FIG. 4(a) to FIG. 3(d), the X-axis delta is the input voltage Vin difference (e.g., delta), and the dotted curve is without linearization, while the solid curve is with linearization. FIG. 4(a) depicts the curve for transconductance Gm. FIG. 4(b) depicts the curve for the first derivation of the transconductance (Gm2). FIG. 4(c) depicts the curve for the second derivation of the transconductance (Gm3). FIG. 4(d) depicts the mean value of the second derivation of the Gm.

As shown in FIG. 4(a), when the delta input voltage Vin difference varies from −0.2V to 0.2V, the transconductance of differential pair will vary from 0.125 to 0.135 A/V. If the proposed linearization technique is applied, then the Gm will vary from 0.115 to 0.118 A/V. The Gm variation is much lower than the one without linearization. A series of derivation of Gm can be made to further observe the different harmonics ingredient that are generated due to the non-linearity of Gm. For example, the first derivation of Gm is relative to second-order intermodulation (IM2) as shown in FIG. 4(b), and the second derivation of Gm is relative to third-order intermodulation (IM3) as shown in FIG. 4(c). It can be seen that the mean value of Gm3 over −0.2V to 0.2V delta is lower when the linearization is applied as shown in FIG. 4(d). With linearization, IM3, which is proportional to magnitude of Gm3, is lower.

Figure 5:
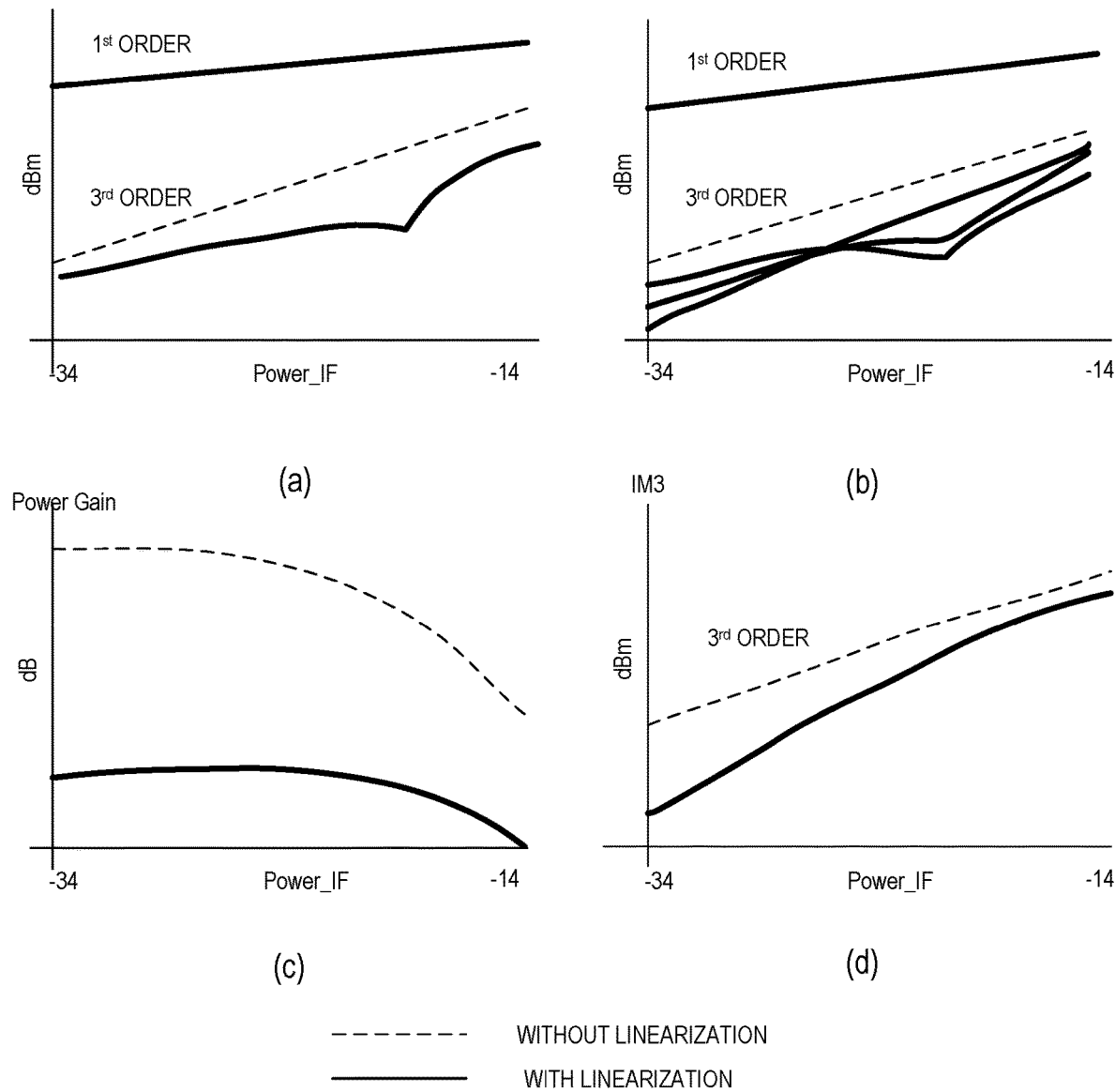
FIGS. 5A, 5B, 5C, and 5D illustrate two-tone simulated results of the differential amplifier in 65 nm CMOS process in accordance with one novel aspect.

FIGS. 5A-5D illustrate two-tone simulated results of the differential amplifier in 65 nm CMOS process in accordance with one novel aspect. In FIG. 5(a) to FIG. 5(b), the input power (e.g., Power_IF) is swept from −34 dBm to −14 dBm. The solid curve is with linearization, while the dotted curve is without linearization. FIG. 5(a) depicts the first and the third-order intermodulation at 200 MHz tone spacing. FIG. 5(b) depicts the first and the third-order intermodulation over 100 k to 200 MHz tone spacing. FIG. 5(c) depicts the power gain of the amplifier. FIG. 5(d) depicts the mean value of the third-order intermodulation over 100 k to 200 MHz tone spacing.

FIG. 5(a) verifies the expectation of lower IM3 under linearization. FIG. 5(a) is simulated results based on specific two-tone spacing frequency 200 MHz. To see the wideband performance of the linearized amplifier, the spacing frequency is swept from 100 k to 200 MHz as shown in FIG. 5(b). The IM3 with linearization are all below than the case without linearization. If the tone spacing are evenly distribution over spacing frequency in a wideband signal, then the overall IM3 improvement will be the mean value of IM3 over 100 k to 200 MHz as shown in FIG. 5(d). FIG. 5(d) shows the linearized amplifier can have 10 dB IM3 improvement. Meanwhile, the power gain only drops 1.5 dB as shown in FIG. 5(c).

Figure 6:
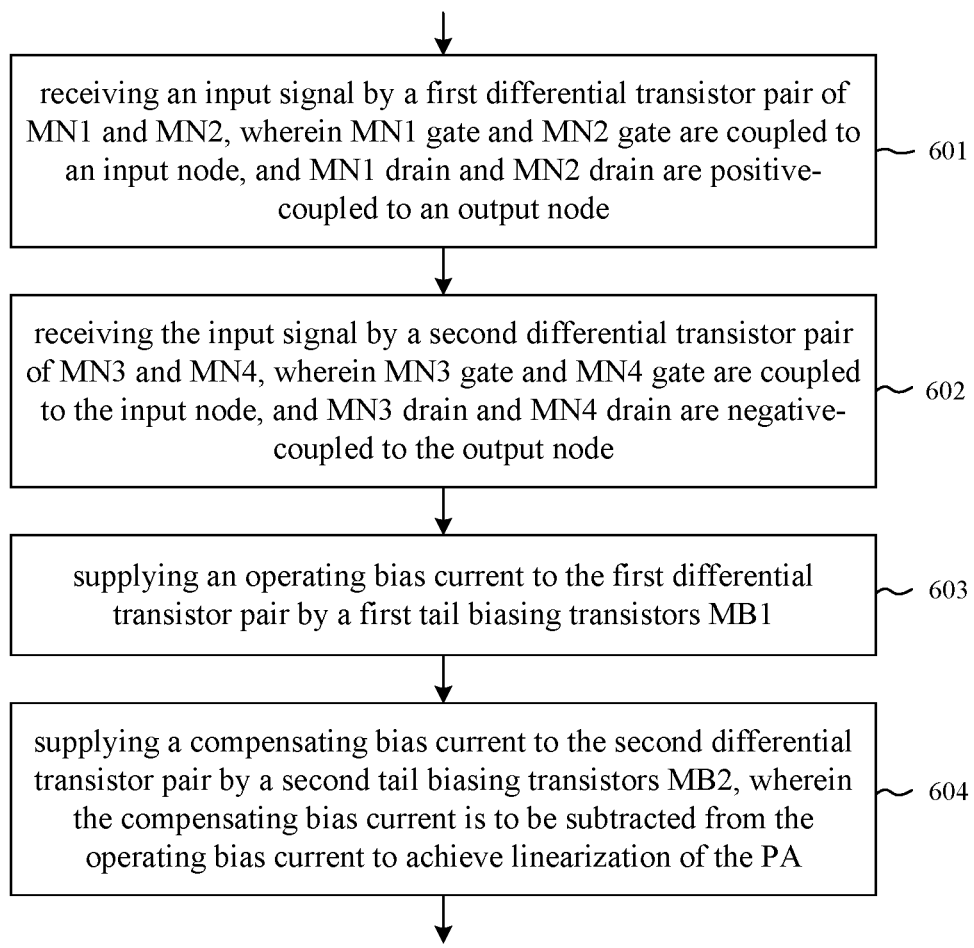
FIG. 6 is a flow chart of a method of power amplifier linearization using current interpolation in accordance with a novel aspect.

FIG. 6 is a flow chart of a method of power amplifier linearization using current interpolation in accordance with a novel aspect. In step 601, a power amplifier receives an input signal by a first differential transistor pair of MN1 and MN2. MN1 gate and MN2 gate are coupled to an input node, and MN1 drain and MN2 drain are positive-coupled to an output node. In step 602, the PA receives the input signal by a second differential transistor pair of MN3 and MN4. MN3 gate and MN4 gate are coupled to the input node, and MN3 drain and MN4 drain are negative-coupled to the output node. In step 603, a first normal tail biasing transistors MB1 supplies an operating bias current to the first differential transistor pair. In step 604, a second compensating tail biasing transistors MB2 supplies a compensating bias current to the second differential transistor pair. The compensating bias current is to be subtracted from the operating bias current to achieve linearization of the PA.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A linearized differential power amplifier (PA), comprising:
   a first differential transistor pair of MN1 and MN2, wherein MN1 gate and MN2 gate are coupled to an input node, and MN1 drain and MN2 drain are positive-coupled to an output node;
   a second differential transistor pair of MN3 and MN4, wherein MN3 gate and MN4 gate are coupled to the input node, and MN3 drain and MN4 drain are negative-coupled to the output node;
   a first normal tail biasing transistor MB1 for supplying an operating bias current to the first differential transistor pair; and
   a second compensating tail biasing transistor MB2 for supplying a compensating bias current to the second differential transistor pair, wherein the compensating bias current is to be subtracted from the operating bias current to achieve linearization of the PA.

2. The PA of claim 1, wherein MB1 has a small channel resistance such that the operating bias current of the first differential transistor pair is higher than the compensating bias current.

3. The PA of claim 1, wherein MB2 has a large channel resistance such that the compensating bias current of the second differential transistor pair is lower than the operating bias current.

4. The PA of claim 1, wherein the first differential transistor pair of MN1 and MN2 generates a positive gain of $+\Delta/2$ for the PA.

5. The PA of claim 1, wherein the second differential transistor pair of MN3 and MN4 generates a negative gain of $-\Delta/2$ for the PA.

6. The PA of claim 1, further comprising:
   a third normal tail biasing transistor MB3 for supplying a second operating bias current to the second differential transistor pair; and
   a fourth compensating tail biasing transistor MB4 for supplying a second compensating bias current to the first differential transistor pair, wherein the second compensating bias current is to be subtracted from the second operating bias current to achieve linearization of the PA.

7. The PA of claim 6, wherein MB3 has a small channel resistance and MB4 has a large channel resistance such that the second operating bias current is higher than the second compensating bias current.

8. The PA of claim 6, wherein a control signal turns on MB1 and MB2 and turns off MB3 and MB4 for a positive power gain $+\Delta/2$ of the PA, and wherein a control signal turns off MB1 and MB2 and turns on MB3 and MB4 for a negative power gain $-\Delta/2$ of the PA.

9. The PA of claim 1, further comprising:
   an input matching network coupled to the input node for receiving input signals; and
   an output matching network coupled to the output node for generating amplified output signals.

10. The PA of claim 1, wherein the linearized PA has a reduced third order intermodulation (IM3) over a wide bandwidth.

11. A method performed by a linearized power amplifier (PA), comprising:
    receiving an input signal by a first differential transistor pair of MN1 and MN2, wherein MN1 gate and MN2 gate are coupled to an input node, and MN1 drain and MN2 drain are positive-coupled to an output node;
    receiving the input signal by a second differential transistor pair of MN3 and MN4, wherein MN3 gate and MN4 gate are coupled to the input node, and MN3 drain and MN4 drain are negative-coupled to the output node;
    supplying an operating bias current to the first differential transistor pair by a first normal tail biasing transistor MB1; and
    supplying a compensating bias current to the second differential transistor pair by a second compensating tail biasing transistors transistor MB2, wherein the compensating bias current is to be subtracted from the operating bias current to achieve linearization of the PA.

12. The method of claim 11, wherein MB1 has a small channel resistance such that the operating bias current of the first differential transistor pair is higher than the compensating bias current.

13. The method of claim 11, wherein MB2 has a large channel resistance such that the compensating bias current of the second differential transistor pair is lower than the operating bias current.

14. The method of claim 11, wherein the first differential transistor pair of MN1 and MN2 generates a positive gain of $+\Delta/2$ for the input signals.

15. The method of claim 11, wherein the second differential transistor pair of MN3 and MN4 generates a negative gain of $-\Delta/2$ for the input signals.

16. The method of claim 11, further comprising:
    supplying a second operating bias current to the second differential transistor pair by a third normal tail biasing transistor MB3; and
    supplying a second compensating bias current to the first differential transistor pair by a fourth compensating tail biasing transistor MB4, wherein the second compensating bias current is to be subtracted from the second operating bias current to achieve linearization of the PA.

17. The method of claim 16, wherein MB3 has a small channel resistance and MB4 has a large channel resistance such that the second operating bias current is higher than the second compensating bias current.

18. The method of claim 16, wherein a control signal turns on MB1 and MB2 and turns off MB3 and MB4 for a positive power gain $+\Delta/2$ of the PA, and wherein a control signal turns off MB1 and MB2 and turns on MB3 and MB4 for a negative power gain $-\Delta/2$ of the PA.

19. The method of claim 11, wherein the input signal is received onto an input matching network (IMN), and wherein an output signal is generated from an output matching network (OMN).

20. The method of claim 11, wherein the linearized PA has a reduced third order intermodulation (IM3) over a wide bandwidth.

* * * * *